US009379128B1

United States Patent
Yi et al.

(10) Patent No.: US 9,379,128 B1
(45) Date of Patent: Jun. 28, 2016

(54) SPLIT GATE NON-VOLATILE MEMORY DEVICE AND METHOD FOR FABRICATING THE SAME

(71) Applicant: UNITED MICROELECTRONICS CORP., Hsinchu (TW)

(72) Inventors: Liang Yi, Singapore (SG); Ko-Chi Chen, Taoyuan (TW); Shen-De Wang, Hsinchu County (TW); Chia-Ching Hsu, Singapore (SG); Chun-Sung Huang, Changhua County (TW); Wen-Peng Hsu, New Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/809,342

(22) Filed: Jul. 27, 2015

(51) Int. Cl.
| *H01L 27/115* | (2006.01) |
| *H01L 29/423* | (2006.01) |
| *H01L 29/66* | (2006.01) |
| *H01L 29/792* | (2006.01) |
| *H01L 21/28* | (2006.01) |
| *H01L 21/225* | (2006.01) |

(52) U.S. Cl.
CPC ...... *H01L 27/11568* (2013.01); *H01L 21/2253* (2013.01); *H01L 21/28282* (2013.01); *H01L 29/4234* (2013.01); *H01L 29/66833* (2013.01); *H01L 29/792* (2013.01)

(58) Field of Classification Search
CPC .............. H01L 27/11568; H01L 21/2253; H01L 21/28282; H01L 29/4234; H01L 29/66833; H01L 29/792
USPC .......................................................... 257/324
See application file for complete search history.

(56) References Cited

U.S. PATENT DOCUMENTS

| 2004/0188753 A1* | 9/2004 | Kawashima | ...... H01L 21/28273 257/316 |
| 2006/0199321 A1* | 9/2006 | Lo | .......... H01L 29/458 438/197 |

* cited by examiner

*Primary Examiner* — Karen Kusumakar
*Assistant Examiner* — Adam S Bowen
(74) *Attorney, Agent, or Firm* — WPAT, PC; Justin King

(57) ABSTRACT

A split gate NVM device includes a semiconductor substrate, an ONO structure disposed on the semiconductor substrate, a first gate electrode disposed on the ONO structure, a second gate electrode disposed on the semiconductor substrate, adjacent to and insulated from the first gate electrode and the ONO structure, a first doping region with a first conductivity formed in the semiconductor substrate and adjacent to the ONO structure, a second doping region with the first conductivity formed in the semiconductor substrate and adjacent to the second gate electrode, and a third doping region with the first conductivity formed in the semiconductor substrate, disposed between the first doping region and the second doping region and adjacent to the ONO structure and the second gate electrode.

19 Claims, 5 Drawing Sheets

ND METHOD FOR FABRICATING
SPLIT GATE NON-VOLATILE MEMORY DEVICE AND METHOD FOR FABRICATING THE SAME

BACKGROUND

1. Technical Field

The disclosure relates in generally related to a semiconductor device and the method for fabricating the same, and more particularly to a split gate non-volatile memory (NVM) device and the method for fabricating the same.

2. Description of the Related Art

An non-volatile memory (NVM) device which is able to continually store information even when the supply of electricity is removed from the device containing the NVM cell has been widespreadly adopted by bulk solid state memory applications in the art.

Split gate memories are a type of non-volatile memory (NVM) that have a control gate and a select gate disposed between two doped regions that are for use as the source and the drain. Typically, the control gate of a split gate NVM cell is disposed over a storage medium that may be a floating gate or a thin film storage layer of nitride. Currently, in order to scale down the split gate structure of the split gate NVM cell and to solve the problems associated with misalignment of the gates and the respective drain and source regions, an oxide-nitride-oxide (ONO) layer is used for serving as the storage medium and the select gate is fabricated by using self-alignment techniques.

However, the self-aligned select gate has ununiformed thickness due to bad etch uniformity control, and the implant ions (such as the implant ions of the light-doped-drain (LDD) implantation) penetrating into the thinner portions of the self-aligned select gate to cause the threshold voltage (Vt) of the self-aligned select gate shift. Such that, hard error of memory cells may be induced by the Vt shift.

Furthermore, as is typical of a NVM cell in general, endurance and data retention are important issues. However, the endurance and data retention of the split gate NVM cell may be deteriorated due to the accumulation of hot holes trapped after several program/erase operations are performed at the point where the ONO layer is discharged through band-to-band hot hole tunneling (BTBHH) near the drain side of the split gate NVM cell mismatching with the point of electrons injection through Fowler-Nordheim tunneling occurring near the source side of the split gate NVM cell.

Therefore, there is a need of providing an improved split gate NVM device and the method for fabricating the same to obviate the drawbacks encountered from the prior art.

SUMMARY

One aspect of the present invention is to provide a split gate NVM device, wherein the split gate NVM device includes a semiconductor substrate, a ONO structure, a first gate electrode, a second gate electrode, a first doping region, a second doping region and a third doping region. The ONO structure is disposed on the semiconductor substrate. The first gate electrode is disposed on the ONO structure. The second gate electrode is disposed on the semiconductor substrate adjacent to and insulated from the first gate electrode and the ONO structure. The first doping region with a first conductivity is formed in the semiconductor substrate and adjacent to the ONO structure. The second doping region with the first conductivity is formed in the semiconductor substrate and adjacent to the second gate electrode. The third doping region with the first conductivity is formed in the semiconductor substrate, disposed between the first doping region and the second doping region and adjacent to the ONO structure and the second gate electrode.

In accordance with another aspect of the present invention, a method for fabricating a semiconductor device is provided, wherein the method includes steps as follows: Firstly, at least one stack having an ONO structure, a first gate electrode and a hard mask layer stacked in sequence is formed on a semiconductor substrate. A first ion implantation process is then performed to form a first doping region and a third doping region in the semiconductor substrate and respectively adjacent to the ONO structure. Next, a conductive layer is formed to cover the hard mask and the semiconductor substrate; and a planarization process using the hard mask layer as a stop layer is performed. Thereafter, a portion of the conductive layer is removed to define a second gate electrode on the semiconductor substrate, adjacent to and insulating from the first gate electrode, the ONO structure and the third doping region. Subsequently, a second ion implantation process is performed to form a channel doping region with a second conductivity in the semiconductor substrate and beneath the second gate electrode. A third ion implantation process is then performed to form a second doping region with the first conductivity in the semiconductor substrate and adjacent to the second gate electrode, so as to make the third doping region disposed between the first doping region and the second doping region.

In accordance with the aforementioned embodiments of the present invention, a split gate NVM device and method for fabricating the same are provided, wherein a select gate electrode is formed by using the self-aligned tech to pattern a planarized conductive layer, and an ion implantation process is performed prior to the forming of the planarized conductive layer. Such that the select gate electrode has a substantially uniform thickness, and an additional doping region having a conductivity identical to that of the doping regions for use as the source and drain is formed between these two doping regions.

Since the additional doping region can direct the hot carriers (electrons/holes) injected into the ONO structure pass through the same region, thus the data retention problems caused by hot holes accumulation can be resolved. In addition, because the select gate electrode having a substantially uniform thickness is provided, hard error of memory cells induced by the Vt shift of the select gate that is likely resulted from the thickness variation of the self-aligned select gate can be avoided.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION

Figure 1A:
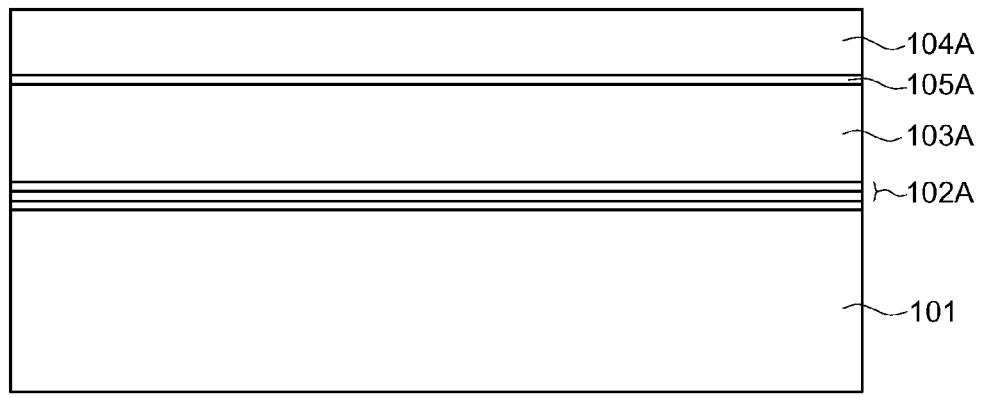
FIGS. 1A to 1J are cross-sectional views illustrating the processing structures for fabricating a split gate NVM device in accordance with one embodiment of the present invention.
Figure 1B:
Figure 1C:
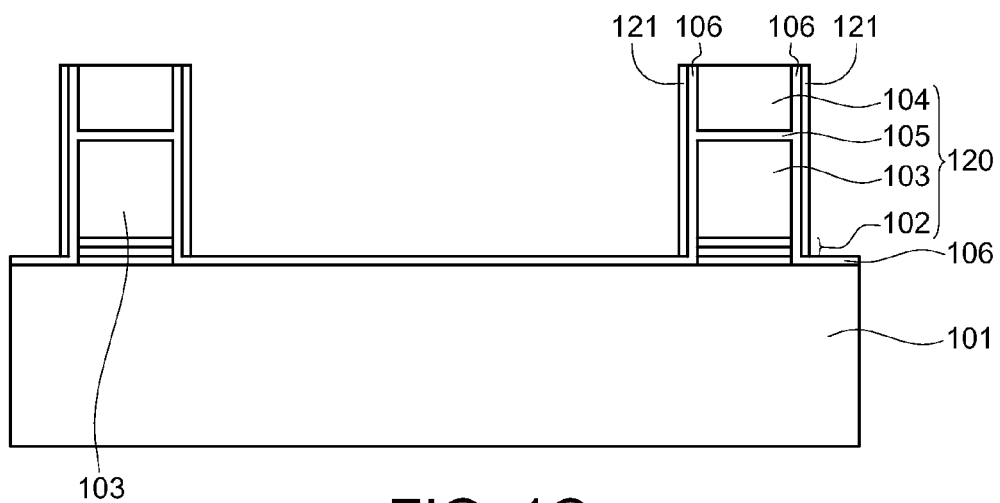
Figure 1D:
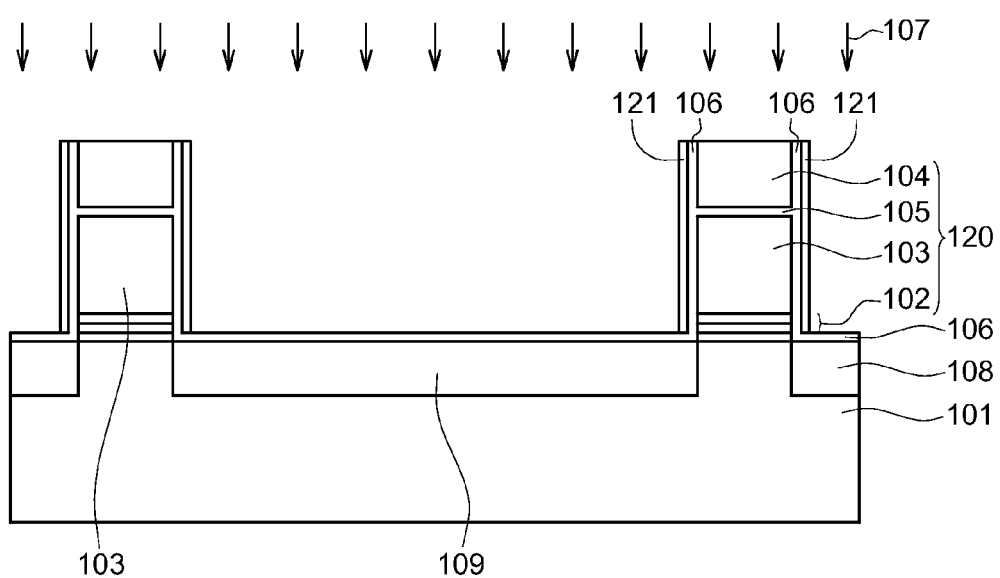
Figure 1E:
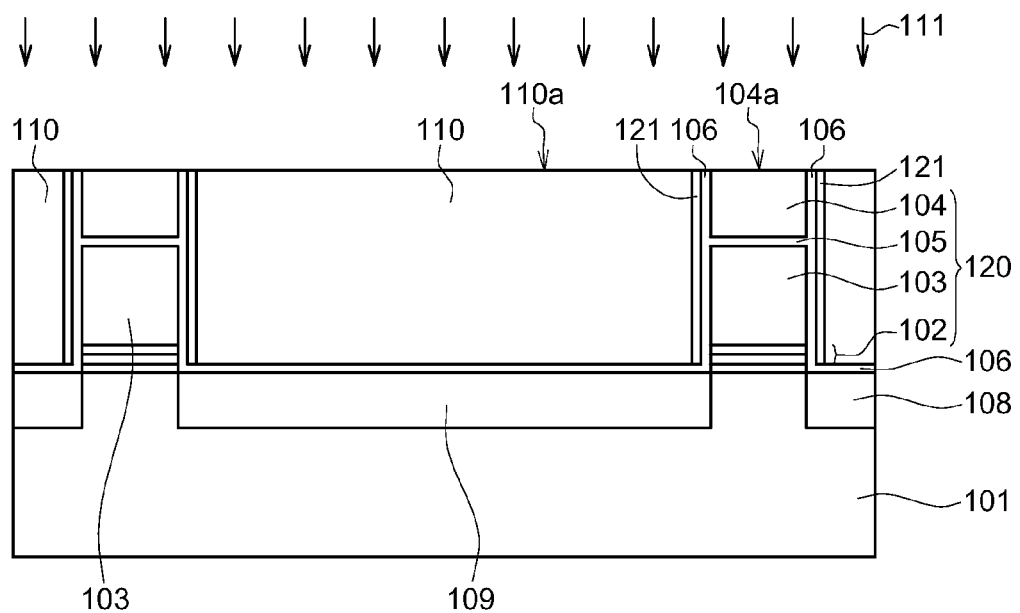
Figure 1F:
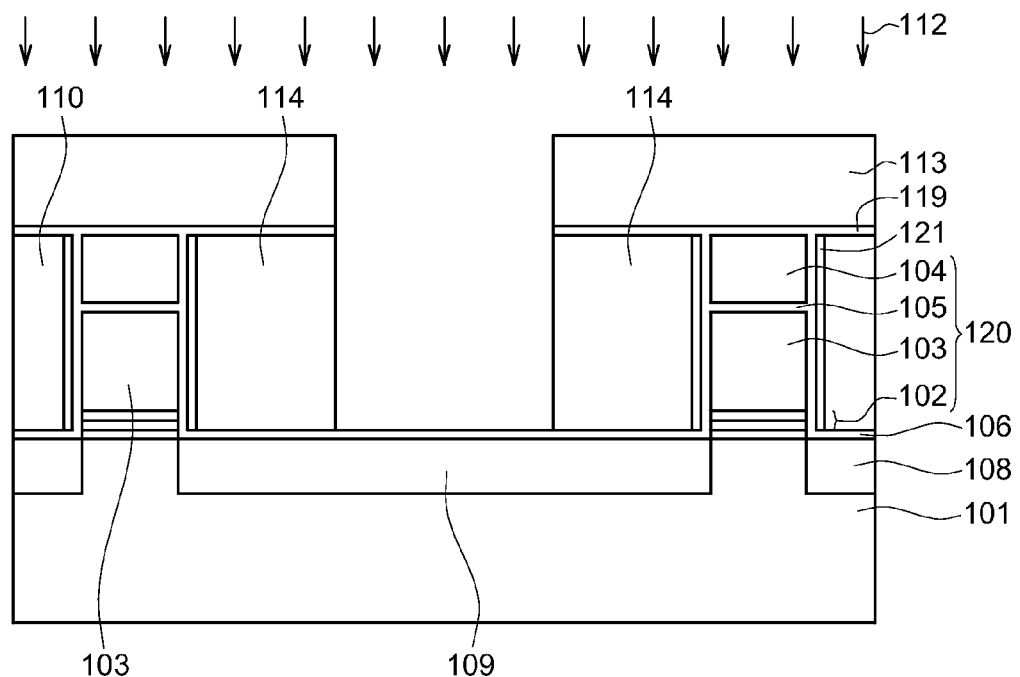
Figure 1G:
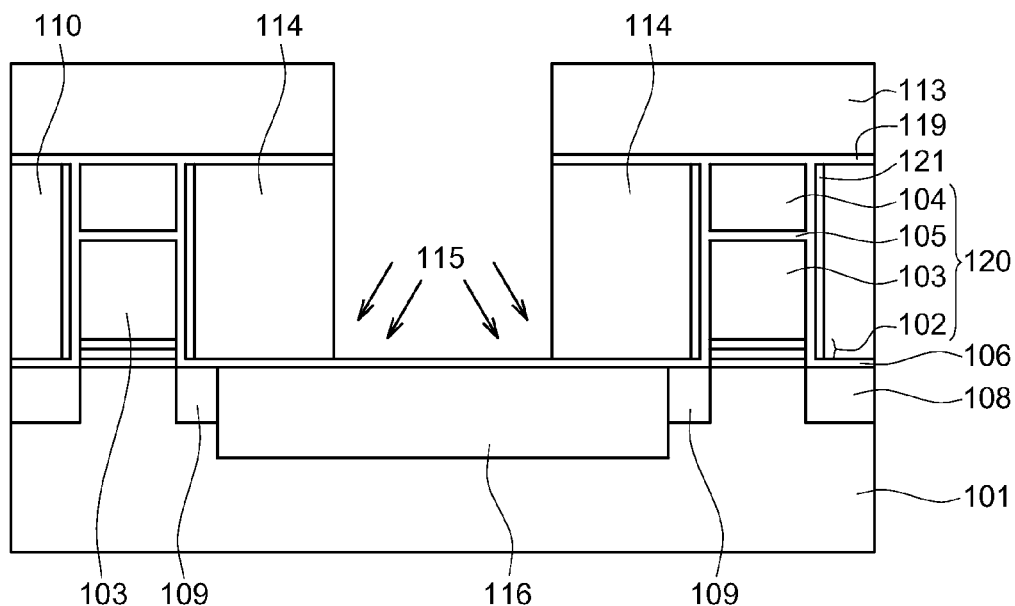
Figure 1H:
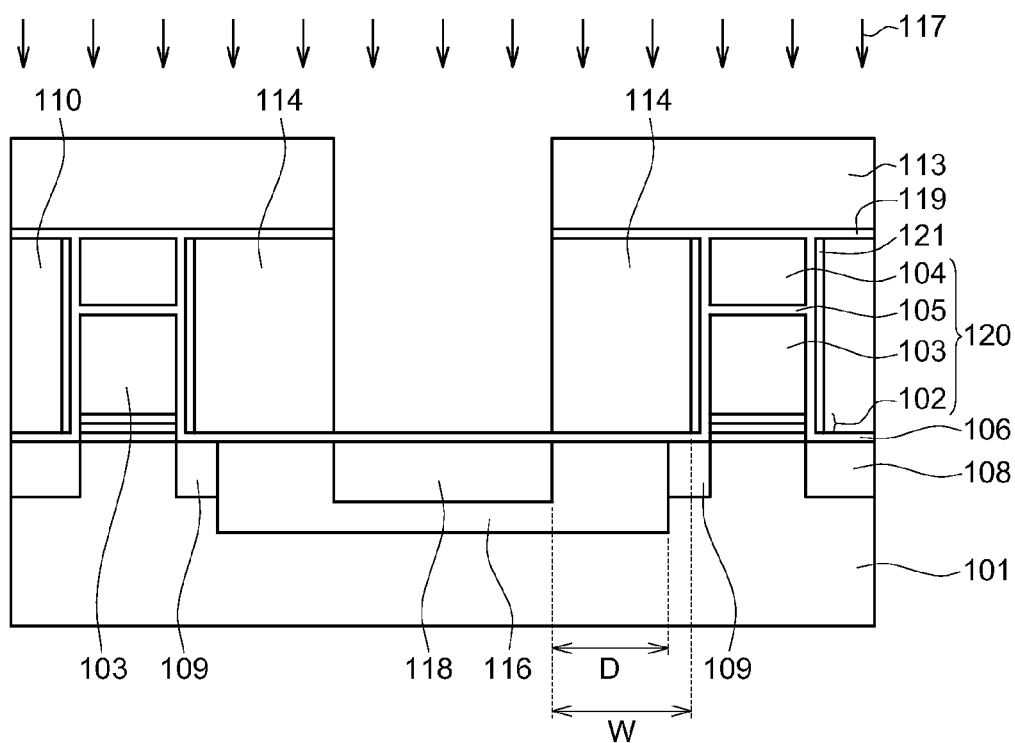

The embodiments as illustrated below provide a split gate NVM device and method for fabricating the same to solve the problems of the Vt shift of the select gate and to solve the problems of deteriorations in endurance and data retention. The present invention will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1J are cross-sectional views illustrating the processing structures for fabricating a split gate NVM device 100 in accordance with one embodiment of the present invention. The method for fabricating the split gate NVM device 100, includes steps as follows: Firstly, a semiconductor substrate 101 is provided, and at least one stack 120 having an ONO structure 102, a first gate electrode 103 and a hard mask layer 104 stacked in sequence is formed on the semiconductor substrate 101. In some embodiments of the present invention, the semiconductor substrate 101 may be a p-type silicon substrate, such as a silicon wafer with at least one p-well.

In some embodiments of the present invention, the forming of the stack 120 includes steps as follows: An ONO composite layer 102A, a poly silicon layer 103A, a silicon oxide layer 105A and a silicon nitride layer 104A are firstly formed in sequence on the semiconductor substrate 101 (see FIG. 1A). The ONO composite layer 102A, the poly silicon layer 103A, the silicon oxide layer 105A and the silicon nitride layer 104A are then patterned by an etching process, such as a reactive-ion etching (RIE), to remove portions of the ONO composite layer 102A, the poly silicon layer 103A, the silicon oxide layer 105A and the silicon nitride layer 104A, so as to form at least one stack having the remained portions of the ONO composite layer 102A, the poly silicon layer 103A, the silicon oxide layer 105A and the silicon nitride layer 104A on the semiconductor substrate 101. In the present embodiment, the remained portions of the ONO composite layer 102A, the poly silicon layer 103A, and the silicon nitride layer 104A respectively serve as the ONO structure 102, the first gate electrode 103, and the hard mask layer 104 of the stack 120 (see FIG. 1B).

Next, an insulation layer 106 is formed to blanket over the stack 120. In the present embodiment, the insulation layer 106 may be formed by performing an oxidation process on the semiconductor substrate 101 made of poly silicon, the ONO structure 102, the first gate electrode 103 made of poly silicon, the remained silicon oxide layer 105 and the hard mask layer 104 made of silicon nitride, so to form a silicon oxide layer blanket over the semiconductor substrate 101 and the stack 120. In some embodiments of the present invention, a plurality of dielectric liners 121 can be optionally formed on the sidewalls of the stack 120 and in contact with the silicon oxide layer 106 (see FIG. 1O). In the present embodiment, the dielectric liners 121 are preferably made of silicon nitride.

Subsequently, a first ion implantation process 107 is performed to form a first doping region 108 and a third doping region 109 with a first conductivity in the semiconductor substrate 101, wherein the first doping region 108 and the third doping region 109 are respectively adjacent to the ONO structure 102. In some embodiments of the present invention, the first ion implantation process 107 is performed by using the stack 120 as a mask to drive a plurality of n-type dopants, such as phosphorus ions (P+), into the p-type semiconductor substrate 101, so as to form the first doping region 108 and the third doping region 109 with n-type conductivity in the semiconductor substrate 101 and respectively adjacent to the ONO structure 102. In the present embodiment, the first doping region 108 and the third doping region 109 are n-type doping regions formed in the semiconductor substrate 101 and respectively adjacent to two opposite sides of the ONO structure 102 (see FIG. 1D).

A conductive layer 110 is then formed to cover the hard mask 104 and (the silicon oxide layer 105 overlying on) the semiconductor substrate 101; and a planarization process 111 using the hard mask layer 104 as a stop layer is performed. As a result, the planarized conductive layer 110 has a plane surface 110a substantially conforming to the top surface 104b of the hard mask layer 104 (see FIG. 1E). In some embodiments of the present invention, the conductive layer 110 may be made of metal or poly-silicon. In the present embodiment, the conductive layer 110 preferably is a poly-silicon layer, and the planarization process 111 can be a chemical mechanical planarization (CMP) process.

Thereinafter, a portion of the planarized conductive layer 110 is removed to define a second gate electrode 114 on the semiconductor substrate 101, adjacent to and insulated from the first gate electrode 103, the ONO structure 102 and the third doping region 109. In some embodiment of a present invention, an etching process 112, such as a RIE process, using a patterned photo-resist layer 113 as a mask can be performed to remove a portion of the planarized conductive layer 110, so as to expose a portion of the third doping region 109, wherein the portion of the remained conductive layer 110 that overlaps with the unexposed part of the third doping region 109 can be designated as the second gate electrode 114.

In the present embodiment, the second gate electrode 114 is directly in contact with the dielectric liners 121 and insulated from the first gate electrode 103 by the insulation layer 106 and the dielectric liners 121. Of note that, because the second gate electrode 114 is made by a portion of the planarized conductive layer 110, the second gate electrode 114 thus may have a substantially uniform thickness (see FIG. 1F).

In some embodiments of the present invention, prior to forming the patterned photo-resist layer 113 on the hard mask 104 and the planarized conductive layer 110 to perform the etching process 112. An optional capping layer 119, such as a silicon oxide layer, can be formed on the hard mask 104 and the planarized conductive layer 110.

Subsequently, a second ion implantation process 115 is performed to form a channel doping region 116 with a second conductivity in the semiconductor substrate 101 and beneath the second gate electrode 114. In some embodiments of the present invention, the second ion implantation process 115 can be a tilted doping process using the photo-resist layer 113 as a mask to drive a plurality of dopants with the second conductivity, such as boron (B), into the portion of the semiconductor substrate 101 beneath the second gate electrode 114, so as to form the channel doping region 116 overlapping with a portion of the third doping region 109 that is disposed beneath the second gate electrode 114.

In the present embodiment, the p-type dopants are titledly implanted into the semiconductor substrate 101 from the end of the second gate electrode 114 away from the first gate electrode 103 during the second ion implantation process 115; and after the second ion implantation process 115 is carried out, at least one thermal treatment, such as a thermal annealing process, may be performed to drive the p-type dopants having a horizontal drift and diffusing into the third doping region 109 beneath the second gate electrode 114. However, there still remains a portion of the third doping region 109 disposed beneath the second gate electrode 114 and adjacent to the first gate electrode 103 kept from being contaminated by the p-type dopants. In other word, merely a portion of the third doping region 109 is overlapped by the channel doping region 116 after the second ion implantation process 115 is carried out (see FIG. 1G).

A third ion implantation process 117 is then performed to form a second doping region 118 with the first conductivity in the semiconductor substrate 101 and adjacent to the second gate electrode 114, so as to make the third doping region 109 disposed between the first doping region 108 and the second doping region 118. In some embodiments of the present invention, the third implantation process 117 is performed by using the photo-resist layer 113 as a mask to drive a plurality of n type dopants, such as phosphorus ions (P+), into the portion of the semiconductor substrate 101 that are not covered by the second gate electrode 114. Such that, the resulted second doping region 118 is disposed adjacent to the channel doping region 116, and the channel doping region 116 is disposed between the second doping region 118 and the third doping region 109.

In the present embodiment, the third doping region 109 and the second doping region 118 are respectively disposed adjacent to two opposite sides of the second gate electrode 114, and the second gate electrode 114 has a lateral width W substantially greater than a separation distance D between the third doping region 109 and the second doping region 118. In other words, the length of the channel doping region 116 is shorter than the lateral width W of the second gate electrode 114 (see FIG. 1H).

Since the channel doping region 116 and the second doping region 118 are formed by using the photo-resist layer 113 which is used to form the second gate electrode 114, thus the mismatch between the channel doping region 116 and the second gate electrode 114 can be avoided. As a result, the variations in length of the channel doping region 116 can be significant reduced, and the problems of Vt shift may be also alleviated.

Figure 1I:
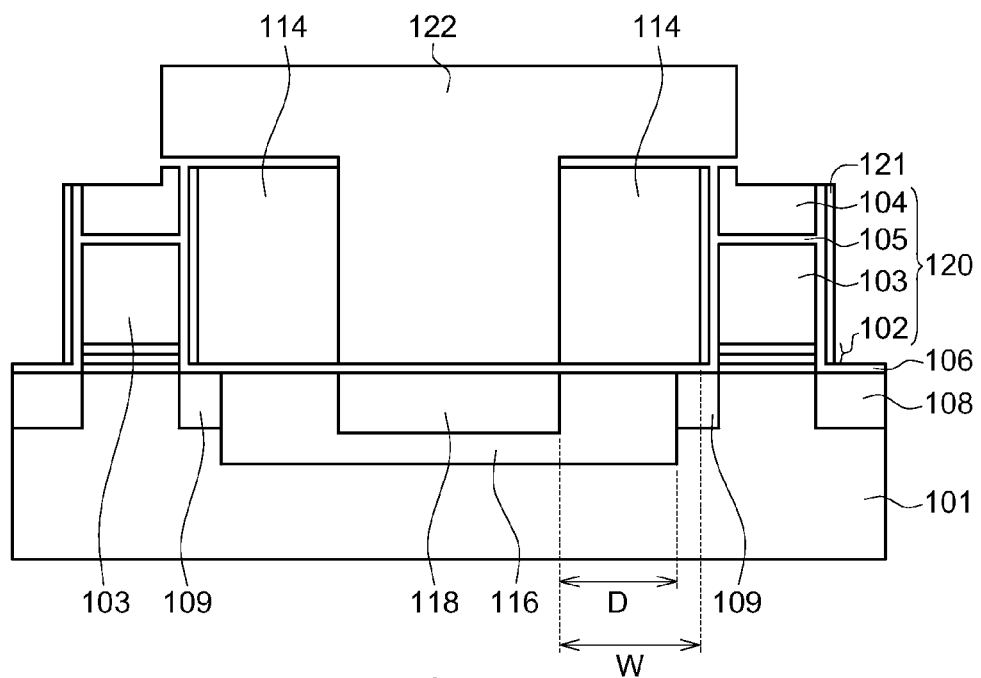

After the photo-resist layer 113 is stripped, the remaining portions of the planarized conductive layer 110 other than the second gate electrode 114 can be removed (see FIG. 1I). In the present embodiment, another photo-resist layer 122 is formed to cover the second gate electrode 114 and the second doping region 118, and a RIE process (not shown) is then performed to remove the remaining portions of the planarized conductive layer 110 that are not covered by the photo-resist layer 122.

Figure 1J:
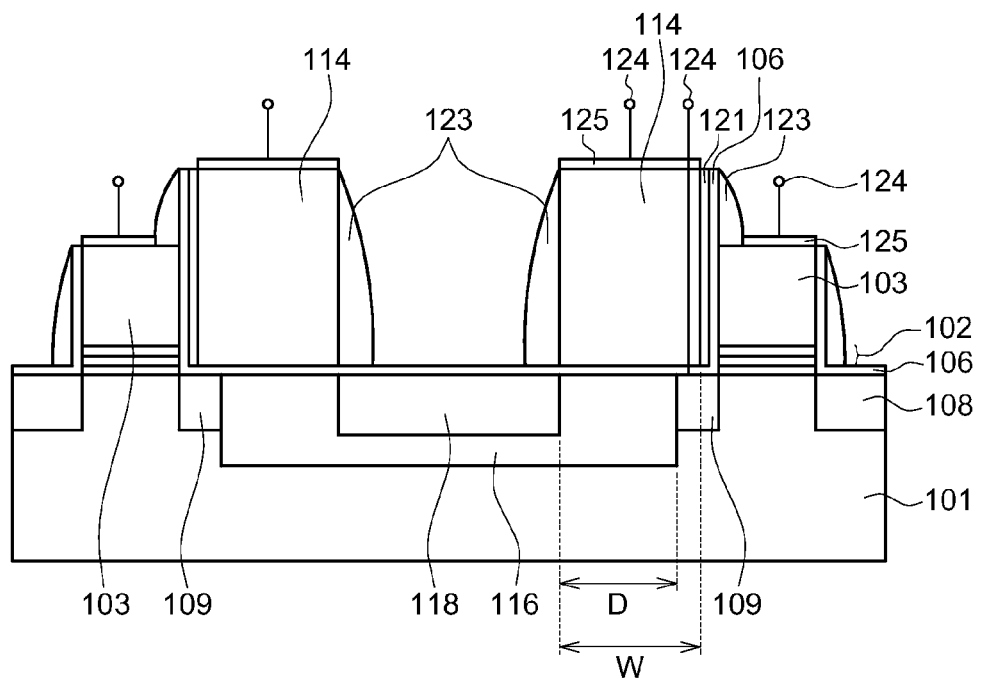

Next, the photo-resist layer 122, the capping layer 119 and the hard mask layer 104 are removed, and a plurality of spacers 123 are formed on sidewalls of the first gate electrode 103 and the second gate electrode 114. After a series of back-end-of-line (BEOL) processes are performed, the split gate NVM device 100 as shown in FIG. 1J can be accomplished. For example, a connecting structure 124 may be formed to electrically connecting the first gate electrode 103, the second gate 114, the first doping region 108, the second doping region 118 and the third doping region 109 with a voltage source respectively. In the present embodiment, prior to the forming of the connecting structure 124, a plurality of silicide layers 125 may be formed on the first gate electrode 103 and the second gate electrode 114.

Referring to FIG. 1J again, the split gate NVM device 100 includes a semiconductor substrate 101, a ONO structure 102, a first gate electrode 103, a second gate electrode 114, a first doping region 108, a second doping region 118 and a third doping region 109. The ONO structure 102 is disposed on the semiconductor substrate 101. The first gate electrode 103 is disposed on the ONO structure 102. The second gate electrode 114 is disposed on the semiconductor substrate 101 adjacent to and insulated from the first gate electrode 103 and the ONO structure 102, wherein the second gate electrode 114 has a substantially uniform thickness. The first doping region 108 with a first conductivity is formed in the semiconductor substrate 101 and adjacent to the ONO structure 102. The second doping region 118 with the first conductivity is formed in the semiconductor substrate 101 and adjacent to the second gate electrode 114. The third doping region 109 with the first conductivity is formed in the semiconductor substrate 101, disposed between the first doping region 108 and the second doping region 118 and adjacent to the ONO structure 102 and the second gate electrode 114.

In the present embodiment, the first gate electrode 103 and the second gate electrode 114 may respectively serve as the control gate electrode and the select gate electrode of the split gate NVM device 100. The first doping region 108 and the second doping region 118 that both have n-type conductivity may respectively serve as the drain and the source of the split gate NVM device 100. There is an additional doping region, such as the third doping region 109, disposed between the source and drain of the split gate NVM device 100 allowing hot holes band-to-band tunneling (BTBT) and electrons source side injection (SSI) occur thereon.

When a program process is performed on the one hand, electrons coming from the semiconductor substrate 101 may be injected into the ONO structure 102 through the third doping region 109 and trapped in the ONO structure 102; and when a erase process is performed on the other hand, the ONO layer is discharged through the semiconductor substrate 101 through the third doping region 109. Since, the hot carriers (electrons/holes) are injected into the ONO structure 102 through the same pass, during the program/erase operations, thus it is unlikely to accumulate hot holes at a certain point of the ONO layer after program/erase cycles. As a result the endurance and data retention of the split gate NVM device 100 can be improved.

In addition, since the second gate electrode 114 is formed by a planarized conductive layer 110 and has a substantially uniform thickness, the implant ions used for fabricating the source and drain may not penetrating into the thinner portions thereof. The problems of hard error of memory cells induced by the Vt shift of the select gate can be solved.

In accordance with the aforementioned embodiments of the present invention, a split gate NVM device and method for fabricating the same are provided, wherein a select gate electrode is formed by using the self-aligned tech to pattern a planarized conductive layer, and an ion implantation process is performed prior to the forming of the planarized conductive layer. Such that the select gate electrode has a substantially uniform thickness, and an additional doping region hasing a conductivity identical to that of the doping regions for use as the source and drain is formed between these two doping regions.

Since the additional doping region can direct the hot carriers (electrons/holes) injected into the ONO structure pass through the same region, thus the data retention problems caused by hot holes accumulation can be resolved. In addition, because the select gate electrode having a substantially uniform thickness is provided, hard error of memory cells induced by the Vt shift of the select gate that is likely resulted from the thickness variation of the self-aligned select gate can be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A split gate non-volatile memory (NVM) device, comprising:
   a semiconductor substrate;
   a ONO structure disposed on the semiconductor substrate;
   a first gate electrode disposed on the ONO structure;
   a second gate electrode disposed on the semiconductor substrate adjacent to and insulated from the first gate electrode and the ONO structure;
   a first doping region with a first conductivity, formed in the semiconductor substrate and adjacent to the ONO structure;
   a second doping region with the first conductivity, formed in the semiconductor substrate and adjacent to the second gate electrode; and
   a third doping region with the first conductivity, formed in the semiconductor substrate between the first doping region and the second doping region, and disposed adjacent to the ONO structure and the second gate electrode, wherein the second gate electrode has a width substantially greater than a separation distance between the third doping region and the second doping region.

2. The split gate NVM device according to claim 1, wherein the second gate electrode has a substantially uniform thickness.

3. The split gate NVM device according to claim 1, further comprising:
   a plurality of spacers, disposed on sidewalls of the first gate electrode and the second gate electrode; and
   a plurality of silicide layers, deposed on the first gate electrode and the second gate electrode.

4. The split gate NVM device according to claim 1, further comprising a channel doping region having a second conductivity formed in the semiconductor substrate between the third doping region and the second doping region.

5. The split gate NVM device according to claim 1, wherein the first doping region has a doping concentration substantially equal to that of the third doping region.

6. The split gate NVM device according to claim 1, wherein the second gate electrode is insulated from the first gate electrode and the ONO structure by a dielectric liner.

7. The split gate NVM device according to claim 1, wherein the third doping region is connected to a voltage source.

8. A method for fabricating a split gate NVM device, comprising:
   forming at least one stack having an ONO structure, a first gate electrode and a hard mask layer stacked in sequence on a semiconductor substrate;
   performing a first ion implantation process to form a first doping region and a third doping region with a first conductivity in the semiconductor substrate and respectively adjacent to the ONO structure;
   forming a conductive layer to cover the hard mask and the semiconductor substrate;
   performing a planarization process using the hard mask layer as a stop layer;
   removing a portion of the planrized conductive layer to define a second gate electrode on the semiconductor substrate, adjacent to and insulated from the first gate electrode, the ONO structure and the third doping region;
   performing a second ion implantation process to form a channel doping region with a second conductivity in the semiconductor substrate and beneath the second gate electrode; and
   performing a third ion implantation process to form a second doping region with the first conductivity in the semiconductor substrate and adjacent to the second gate electrode, so as to make the third doping region disposed between the first doping region and the second doping region, and to make the second gate electrode has a width substantially greater than a separation distance between the third doping region and the second doping region.

9. The method according to claim 8, wherein the process of forming of the stack comprising:
   forming an ONO composite layer, a poly silicon layer, a silicon oxide layer and a silicon nitride layer in sequence on the semiconductor substrate; and
   patterning the ONO composite layer, the poly silicon layer, the silicon oxide layer and the silicon nitride layer.

10. The method according to claim 9, prior to performing the first ion implantation process, further comprising forming an insulation layer blanket over the stack.

11. The method according to claim 10, wherein the semiconductor substrate, the first gate electrode and the hard mask layer comprises silicon, and the process for forming the insulation layer comprises performing an oxidation process to form a silicon oxide layer blanket over the stack and the semiconductor substrate.

12. The method according to claim 10, further comprising forming a dielectric liner on sidewalls of the stack and in contact with the insulation layer.

13. The method according to claim 8, wherein the process for forming the second electrode comprises performing an etching process using a photo-resist layer as a mask to remove the portion of the planrized conductive layer.

14. The method according to claim 13, wherein the second ion implantation process comprises a tilted doping process using the photo-resist layer as a mask to drive a plurality of dopants with the second conductivity into a portion of the semiconductor substrate beneath the second gate, so as to form the channel doping region overlapping with a portion of the third doping region.

15. The method according to claim 14, further comprising performing at least one thermal treatment to drive the dopants with the second conductivity having a horizontal drift.

16. The method according to claim 14, wherein the third implantation process is performed by using the photo-resist layer as a mask to drive a plurality of dopants with the first conductivity into the semiconductor substrate and adjacent to the second gate.

17. The method according to claim 8, after the forming of the second doping region further comprising:
   removing a portion of the conductive layer overlying on the first doping region; and
   removing the hard mask layer.

18. The method according to claim 17, after removing the hard mask layer, further comprising:
   forming a plurality of spacers, on sidewalls of the first gate electrode and the second gate electrode; and
   forming a plurality of silicide layers, on the first gate electrode and the second gate electrode.

19. The method according to claim 8, further comprising forming a connecting structure electrically connecting the third doping region with a voltage source.

\* \* \* \* \*